(12) United States Patent
Walker et al.

(10) Patent No.: US 6,825,546 B1
(45) Date of Patent: Nov. 30, 2004

(54) CMOS VARACTOR WITH CONSTANT DC/DV CHARACTERISTIC

(75) Inventors: John Q. Walker, Colorado Springs, CO (US); Todd A. Randazzo, Colorado Springs, CO (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/035,346

(22) Filed: Dec. 28, 2001

(51) Int. Cl.[7] ............................................. H01L 29/93
(52) U.S. Cl. ..................................... 257/596; 257/595
(58) Field of Search ................................ 257/595–602

(56) References Cited

U.S. PATENT DOCUMENTS

| | | | | |
|---|---|---|---|---|
| 3,638,300 A | * | 2/1972 | Foxhall et al. | 257/480 |
| 3,914,708 A | * | 10/1975 | Stover et al. | 332/30 |
| 4,064,620 A | * | 12/1977 | Lee et al. | 29/580 |
| 4,226,648 A | * | 10/1980 | Goodwin et al. | 438/379 |
| 4,954,850 A | * | 9/1990 | Kasahara | 257/597 |
| 5,506,442 A | * | 4/1996 | Takemura | 257/597 |
| 6,653,716 B1 | * | 11/2003 | Vashchenko et al. | 257/596 |

OTHER PUBLICATIONS

Sze, *Physics of Semiconductor Devices*, 2nd Edition John Wiley, 1981, describing varactor operation, 3 pages.

* cited by examiner

*Primary Examiner*—Ori Nadav
(74) *Attorney, Agent, or Firm*—John R. Ley, LLC

(57) ABSTRACT

A varactor is formed with a semiconductor junction having a retrograde dopant concentration profile in a depletion region. The retrograde dopant concentration profile results in an approximately linear capacitance/voltage characteristic response of the varactor. The retrograde dopant concentration profile also enables a peak of the dopant concentration to function as a low resistance conductive path connecting to the varactor.

5 Claims, 6 Drawing Sheets

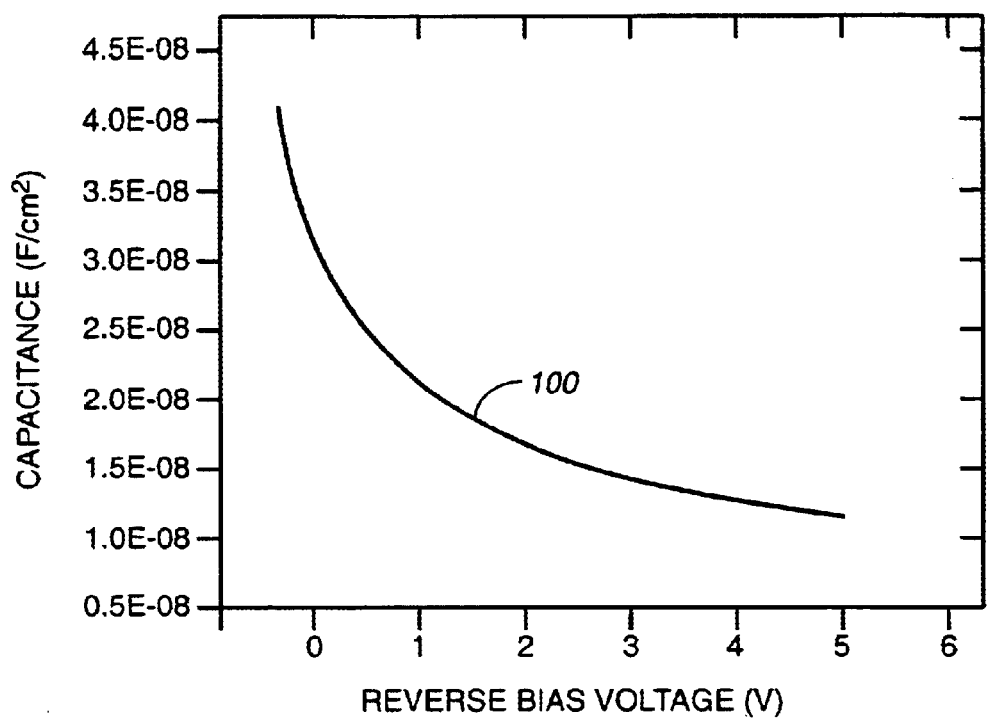
FIG._1
*(PRIOR ART)*
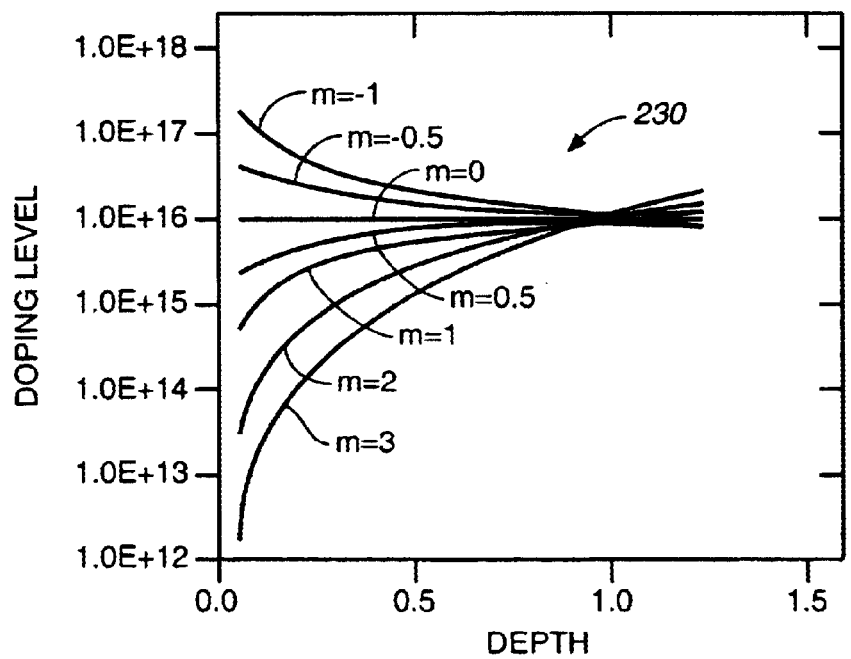
FIG._3

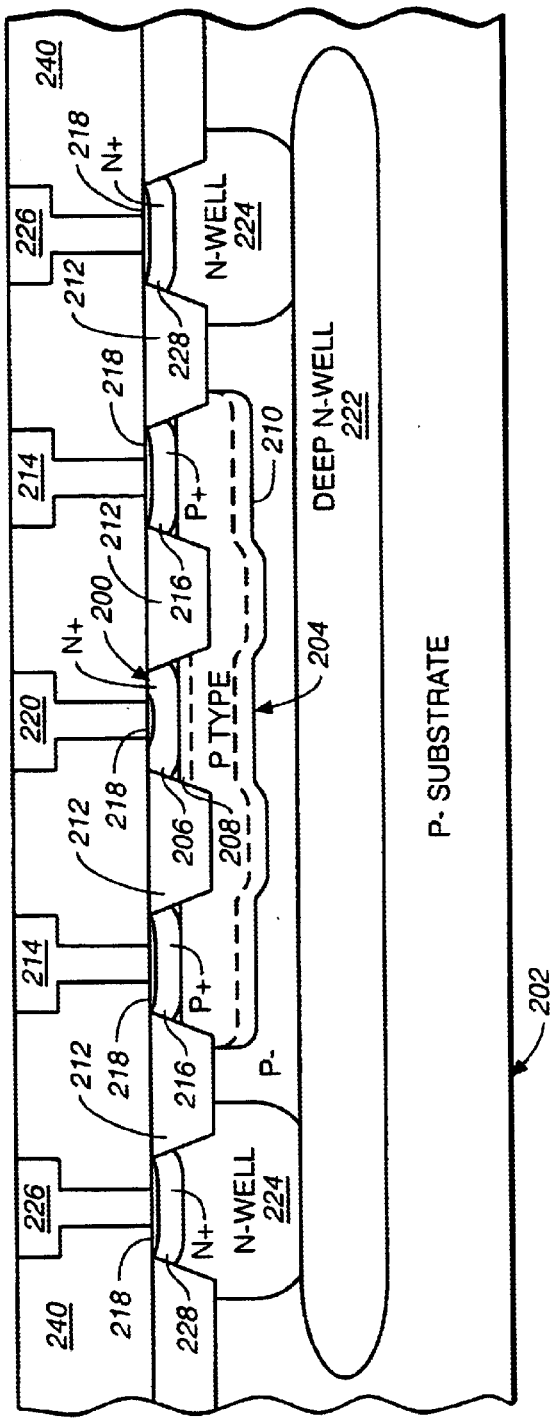
FIG._2
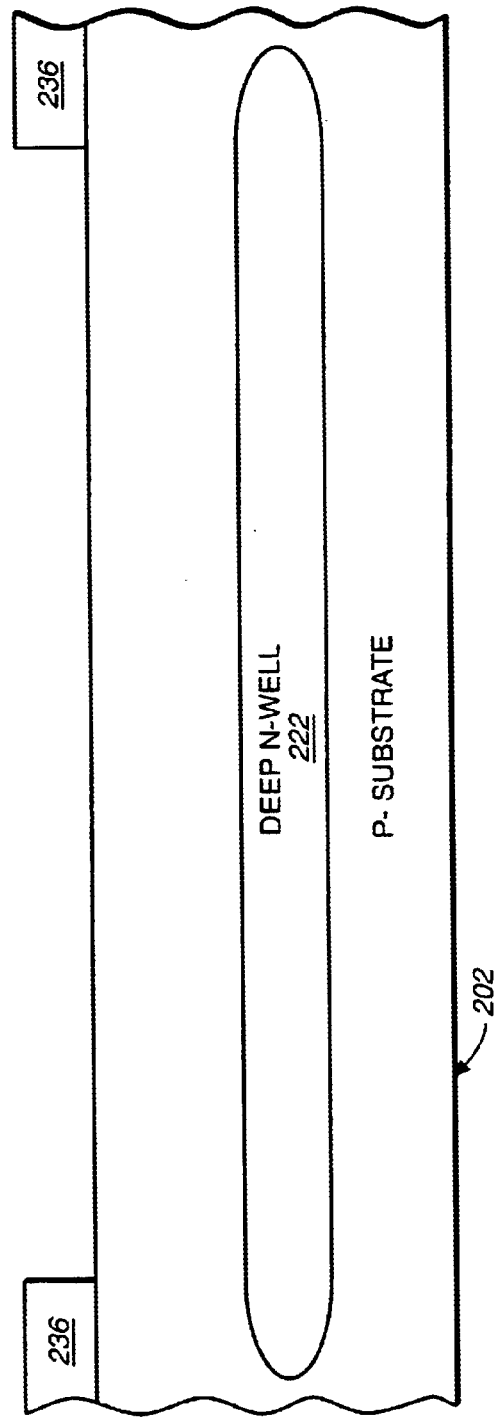
FIG._6

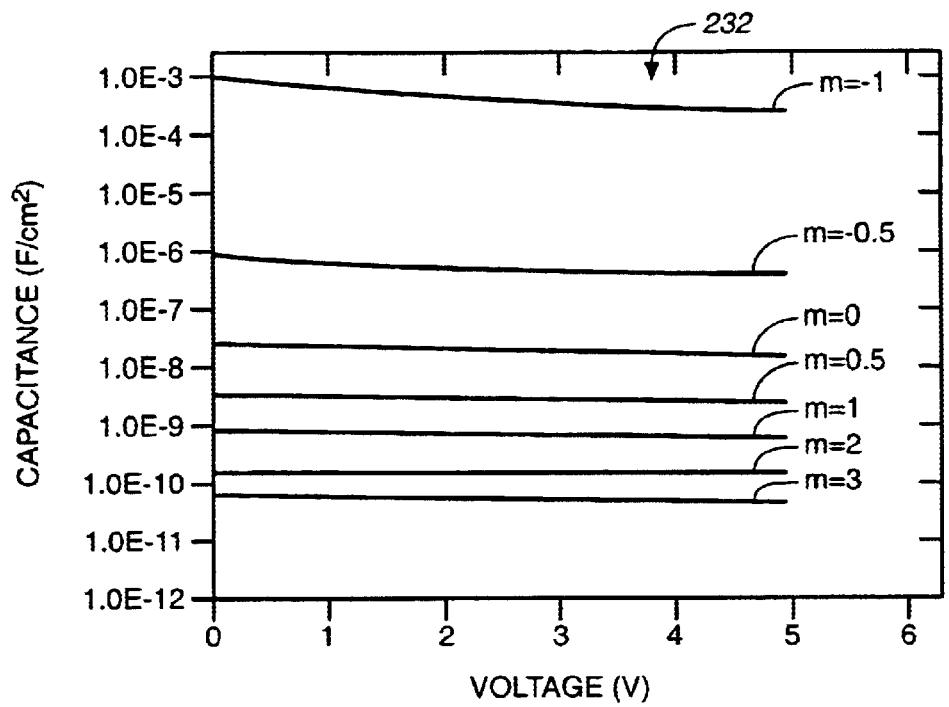
FIG._4
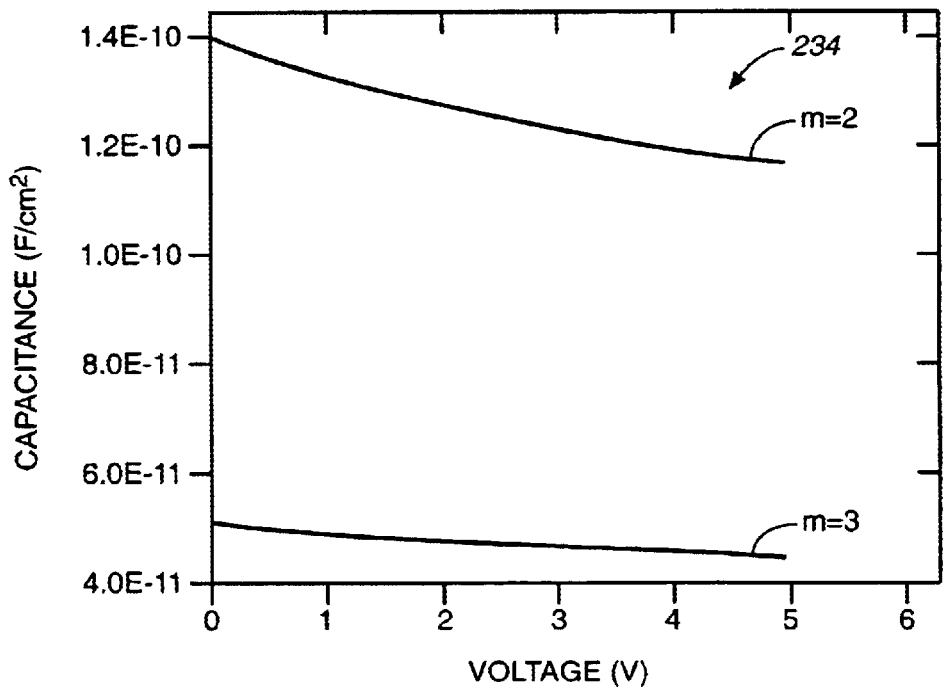
FIG._5

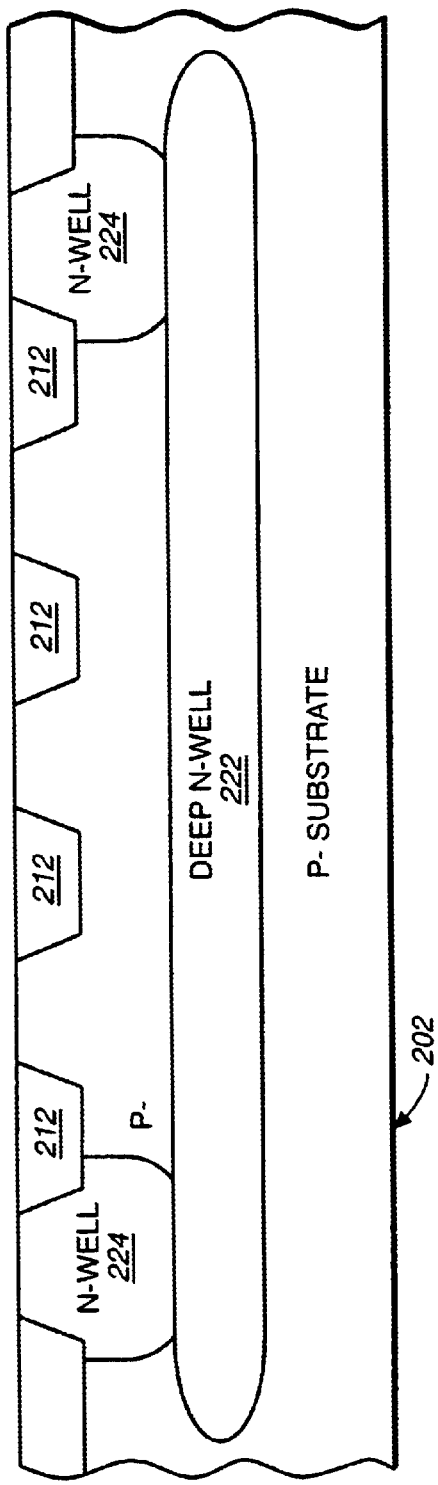
FIG._7
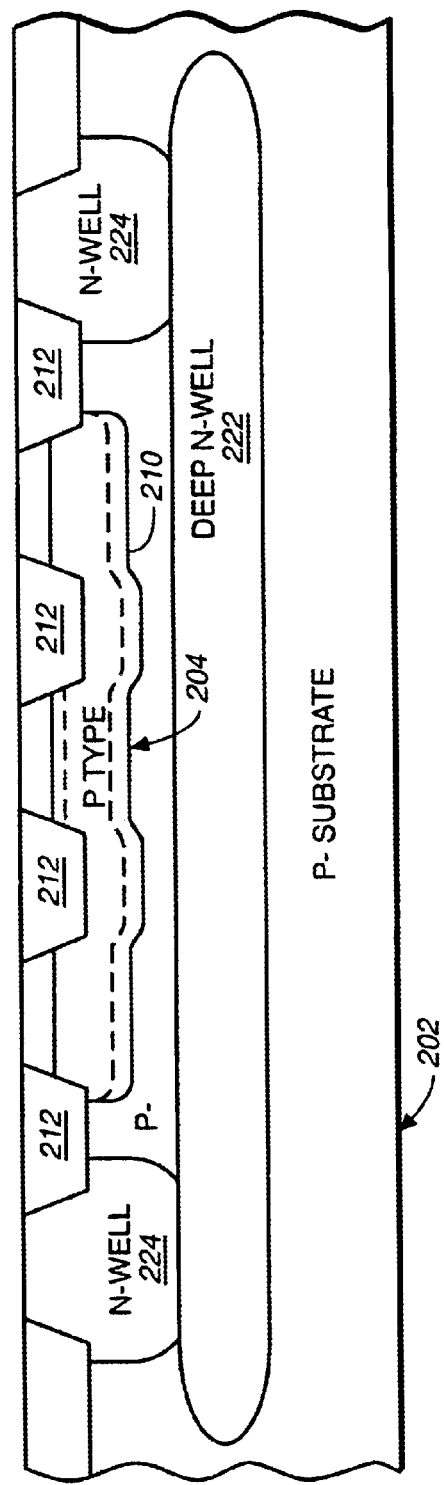
FIG._8

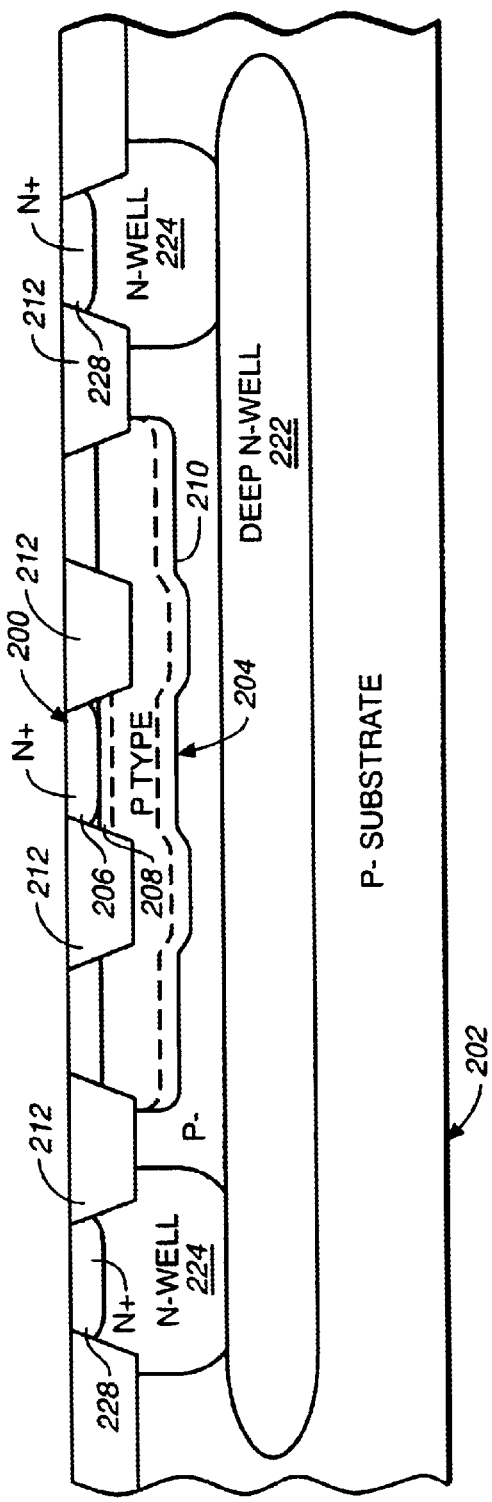
FIG._9
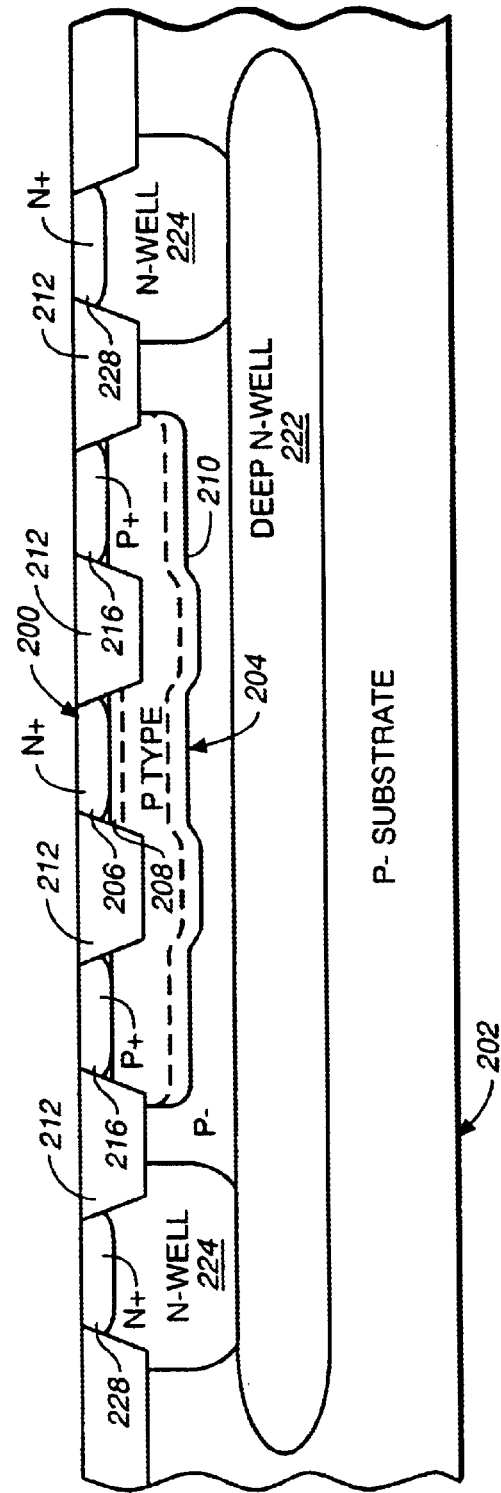
FIG._10

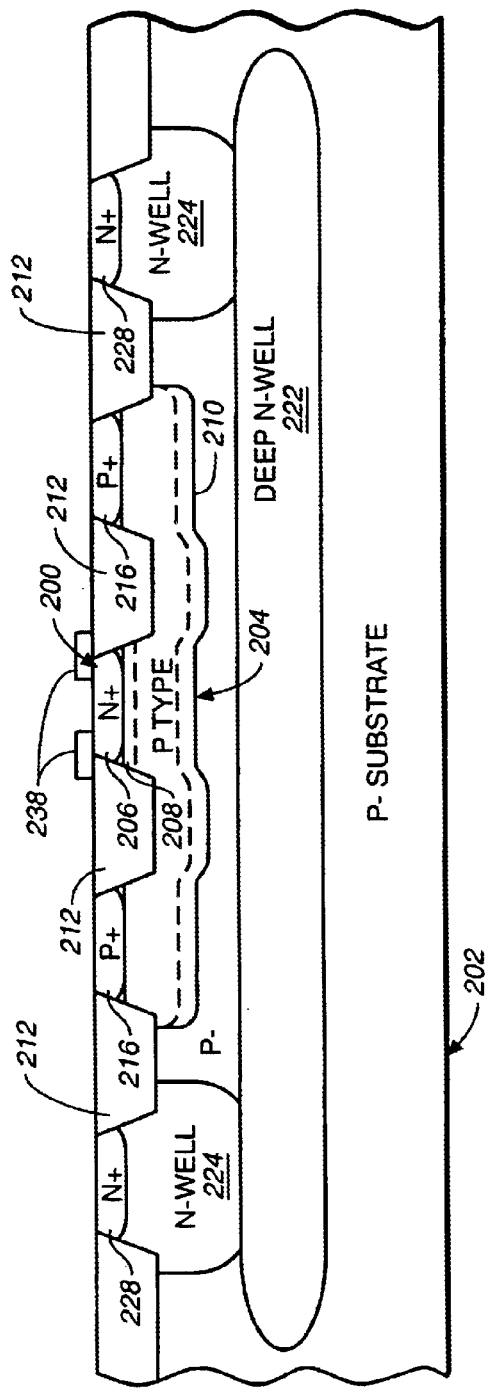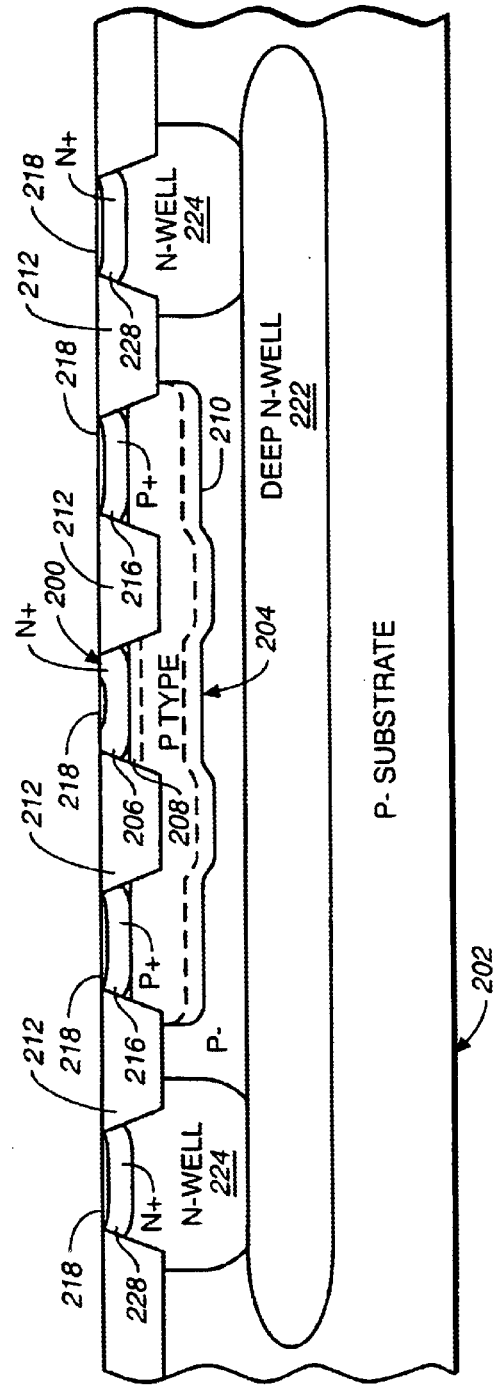
FIG._11  FIG._12

CMOS VARACTOR WITH CONSTANT DC/DV CHARACTERISTIC

FIELD

The subject matter herein relates to a varactor with a linear capacitance to voltage (CN) response, i.e. a constant dC/dV characteristic. More specifically, the subject matter herein relates to a varactor having a retrograde dopant profile in a diode junction depletion region resulting in the linear CN response.

BACKGROUND

A varactor is a capacitor for which its capacitance changes with applied voltage. Varactors are commonly used in broadband RF (radio frequency) applications. A diode junction is commonly used to form a varactor in an integrated circuit (IC), since the depletion region of the diode acts as a capacitor dielectric between two capacitor plates. Semiconductor material in the depletion region is typically doped either uniformly (e.g. at a dopant concentration of $1.0E16/cm^3$ at room temperature) or decreasing with depth.

As a reverse bias voltage is applied to the varactor, the width of the depletion region increases, thereby decreasing the capacitance. This effect (i.e. capacitance/voltage response) is illustrated in a capacitance/voltage plot 100 for a typical varactor shown in FIG. 1. The plot 100 is distinctly nonlinear. The nonlinearity of the capacitance/voltage response affects (often negatively) the performance of the varactor and, therefore, the design of the varactor and the overall IC.

Additionally, semiconductor junctions commonly experience leakage current, resulting in resistances associated with (in this case) the varactor. Schematically, this resistance is in parallel with the variable capacitance of the varactor. There is also typically a series resistance associated with the varactor. Both resistances are typically undesirable because they can adversely affect the performance of the varactor and, therefore, the design of the varactor and the overall IC.

It is with respect to these and other background considerations that the subject matter herein has evolved.

SUMMARY

The subject matter described herein involves a varactor formed from a diode junction with a retrograde dopant profile in the depletion region of the diode junction. In other words, the dopant concentration increases, rather than decreases or remains constant, with the depth of the depletion region. In this manner, the resulting capacitance/voltage response characteristic of the varactor is more nearly linear than in the prior art.

In one particular embodiment, the dopant concentration N as a function of the depth x of the depletion region (i.e. the dopant profile) is given by the equation $N=Bx^m$, where B is a concentration constant (e.g. $1.0E16/cm^3$, or in a range from $1.0E13/cm^3$ to $1.0E19/cm^3$, depending on the application) and m is an exponent that determines the degree of curvature, or variation, of the dopant profile. In this embodiment, a greater exponent m typically results in a greater degree of curvature of the dopant profile and a more linear capacitance/voltage response characteristic.

Additionally, in a particular embodiment, since the dopant concentration increases away from the diode junction, the peak of the dopant concentration is at a level outside the depletion region and is not cut off from an external contact for the varactor. Thus, the peak region of the dopant concentration acts as a low resistance connection for the varactor, resulting in a lower parasitic series resistance associated with the varactor than in the prior art.

A more complete appreciation of the present disclosure and its scope, and the manner in which it achieves the above noted improvements, can be obtained by reference to the following detailed description of presently preferred embodiments taken in connection with the accompanying drawings, which are briefly summarized below, and the appended claims.

BRIEF DESCRIPTION OF THE DRAWINGS

FIG. 1 is a graph of a capacitance/voltage characteristic response for a prior art varactor.

FIG. 2 is a cross section of a varactor incorporating the present invention.

FIG. 3 is a set of graphs for different doping levels vs. depths in the varactor shown in FIG. 2.

FIGS. 4 and 5 are graphs of capacitance/voltage characteristic responses for the varactor shown in FIG. 2.

FIGS. 6, 7, 8, 9, 10, 11 and 12 are cross sections of the varactor shown in FIG. 2 illustrating steps in the fabrication of the varactor.

DETAILED DESCRIPTION

A varactor 200 may be formed in a semiconductor (e.g. silicon) substrate 202, as shown in FIG. 2. (The same, or a similar, structure may also be used as a band gap voltage reference for RF mixed signal designs.) A bottom side 204 of the varactor 200 is doped with one type of dopant (e.g. P type). A top side 206, a source/drain region, of the varactor 200 is doped with another type of dopant (e.g. N type), as are other conventional source/drain regions (not shown). (Although the varactor 200 is shown and described as having particular types of dopants, it is understood that these particular dopants are exemplary only and that the varactor 200 can be formed with any appropriate combination of types of dopants.) The top and bottom sides 206 and 204 of the varactor 200, therefore, form a diode junction with a depletion region 208. Upon applying a reverse biased voltage to the diode junction (top and bottom sides 206 and 204), the depletion region 208 is enlarged in the bottom side 204. The depletion region 208 functions as a capacitor dielectric, and the top and bottom sides 206 and 204 function has capacitor plates for the varactor 200. As the reversed biased voltage is increased, the depth of the depletion region 208 is increased, thereby reducing the capacitance of the varactor 200. In this manner, the varactor 200 is a variable capacitance capacitor.

The bottom side 204 of the varactor 200 is doped with a retrograde dopant concentration profile. In other words, the concentration of the dopant in the bottom side 204 increases from the junction between the top and bottom sides 206 and 204 to a peak concentration region 210 deeper within the bottom side 204, as described below with reference to FIG. 3. In this manner, the capacitance/voltage (C/V) characteristic response of the varactor 200 is approximately linear, rather than curved, as described below with reference to FIGS. 4 and 5.

In addition to the approximately linear CN characteristic response, the retrograde dopant concentration profile also ensures that the peak concentration region 210 is outside the depletion region 208 and below shallow trench isolation (STI) structures 212 (or other isolation structures, such as formed by Local Oxidation of Silicon "LOCOS") that separate portions of the varactor 200. In this manner, the peak concentration region 210 functions as a conductive path between the portion of the bottom side 204 that is adjacent to the top side 206 and the portion of the bottom side 204 that connects to conventional bottom side electrical contacts 214 (e.g. metal interconnects) through conventional P+ doped source/drain regions 216. A greater amount of dopant in a semiconductor results in a lower resistance. Therefore, the peak concentration region 210 enables the varactor 200 to have a lower parasitic series resistance associated therewith than does the prior art.

To further reduce the series resistance associated with the varactor 200, a layer 218 of salicide, as used in a conventional CMOS process, is used to connect the top side 206 to a conventional top side electrical contact 220 and the bottom side 204 (through the source/drain regions 216) to the bottom side electrical contacts 214. The salicide layer 218 enhances the electrical contacts of the top side 206 (N+ source/drain region) and the P+ source/drain regions 216 with the top and bottom side electrical contacts 220 and 214, respectively. Additionally, the STI structures 212 are formed with a width as short as possible, so the distance of the peak concentration region 210, and hence the resistance thereof, is held to a minimum.

To minimize the parasitic parallel resistance associated with the varactor 200, the salicide layer 218 in the top side 206 is formed with a narrow width. Thus, the salicide layer 218 is separated from the STI structures 212. In this manner, the current leakage across the junction from the bottom side 204 to the salicide layer 218 next to the STI structures 212 is minimized or eliminated.

Additionally, this current leakage may be caused by dislocations due to damage caused by implanting the dopants. Thus, conventional anneals performed to remove such damage from other regions of the integrated circuit (not shown) during the typical CMOS procedures should work to reduce this current leakage too.

Additionally, when necessary, the varactor 200 may be isolated from the remainder of the semiconductor substrate 202 by a deep well 222 (e.g. a deep N-well) and side wells 224 (e.g. N-wells). A voltage (e.g. a ground voltage) is applied through well contacts 226, salicide layers 218 and N+ doped source/drain regions 228 to the side wells 224 and to the deep well 222. In this manner, parasitic capacitances associated with the varactor 200 are reduced or minimized.

The retrograde dopant concentration profile of the bottom side 204 (FIG. 2) may be defined in any appropriate manner that will cause the capacitance/voltage characteristic of the varactor 200 (FIG. 2) to be almost linear. Doping level ("N," e.g. atoms/cm$^3$) vs. depth ("x," e.g. microns) graphs 230 shown in FIG. 3, for example, illustrate different dopant concentration profiles that are defined by an equation: $N=Bx^m$, where B is a concentration constant (e.g. 1.0E16/cm$^3$, or in a range from 1.0E13/cm$^3$ to 1.0E19/cm$^3$, depending on the application) and m is an exponent that determines the degree of curvature, or variation, of the dopant profile or the graphs 230. As illustrated by the graphs 230, a greater exponent m typically results in a greater degree of curvature of the dopant profile. The greater degree of curvature of the dopant profile typically results in a more linear capacitance/voltage response characteristic, as described below with reference to FIGS. 4 and 5. The positive values of m (0.5, 1, 2 and 3) represent the retrograde dopant concentration profiles. A zero value (0, i.e. uniform dopant concentration) and negative values (−0.5 and −1, i.e. decreasing concentration with increasing depth) are presented for comparison.

The P type doping of the bottom side 204 (FIG. 2) may be performed as a single implant or as a sequence of implants (i.e. an "implant chain") to form the retrograde dopant concentration profile in the flow of conventional CMOS procedures used to form other structures in the semiconductor substrate 202. As long as the dopant species is not changed, sequenced implants add little cost to the fabrication because they run together in the same semiconductor fabrication tool. In a single implant procedure, the intensity of the ion beam is varied while varying the amount of time spent at each intensity, so greater time is spent at higher intensity to produce the retrograde dopant concentration profile. In a sequence of implants, each implant is performed at a different dose and energy to produce the same profile. For example, a deep high concentration implant may be performed in addition to a shallower low concentration implant. Alternatively, two implants that produce different profiles but that sum together to form the desired profile may be performed. Additionally, diffusion steps that might affect the formation of the dopant concentration profile must be accounted for, particularly if required for the fabrication of other CMOS devices in the integrated circuit (not shown).

Graphs 232 and 234 of the capacitance/voltage characteristic response for the doping level vs. depth graphs 230 (FIG. 3) are shown in FIGS. 4 and 5, respectively. The graphs 232 are semi-log scale graphs of the capacitance/voltage characteristic responses for the varactor 200 (FIG. 2) at each of the values of the exponent m (−1, −0.5, 0, 0.5, 1, 2 and 3) as calculated according to conventional equations of semiconductor physics. It is apparent from the graphs 232 that the capacitance/voltage characteristic response for the dopant concentration profile with a greater exponent m (e.g. 3) is more nearly linear than that for the dopant concentration profile with a lesser exponent m (e.g. −1) over the voltage range shown. The graphs 234 are linear scale graphs (with a higher vertical-axis resolution than that of graphs 232) of the capacitance/voltage characteristic responses for the varactor 200 at the two greatest values of the exponent m (2 and 3). At the higher resolution of graphs 234, it is more readily apparent that the graph 234 at m=3 is more nearly linear than the graph 234 at m=2 over the voltage range shown. Therefore, it is generally preferable to select the highest possible degree of curvature for the dopant concentration profile (e.g. the value of m) in order to ensure a greater degree of linearity for the capacitance/voltage characteristic response. However, it is generally more costly and time-consuming to form a dopant concentration profile with a higher degree of curvature than with a lower degree of curvature. Thus, for a given integrated circuit design, it is generally preferable to select the lowest degree of curvature for the dopant concentration profile that results in an acceptable degree of linearity for the capacitance/voltage characteristic response over the voltage range required for the given design.

The steps for forming the varactor 200 (FIG. 2) are described with reference to FIGS. 6–12. The fabrication of the varactor 200 may be integrated with an RF radio frequency) CMOS process or other semiconductor fabrication process. However, the process sequence described herein will show only the steps for the formation of the varactor 200.

A resist 236 is deposited onto the semiconductor substrate 202, as shown in FIG. 6, and patterned for the formation of the optional deep well 222. The semiconductor substrate 202 is generally a low-doped area. The deep well 222 is then implanted at the desired depth within the semiconductor substrate 202.

The resist 236 (FIG. 6) is removed and another resist (not shown) is deposited onto the semiconductor substrate 202 and patterned for the formation of the STI structures 212, as shown in FIG. 7. After the STI structures 212 are formed, another resist (not shown) is deposited onto the semiconductor substrate 202 and patterned for the formation of the side wells 224, which also act as "sinkers" for the optional deep well 222. The side wells 224 are then implanted within the semiconductor substrate 202, and the resist used to form the side wells 224 is removed. The deep well 222 is an optional layer used for noise isolation in RF circuits. Additionally, the Nwells 224 are used to form back gate connections and channels for all PMOS devices.

Another resist (not shown) is deposited onto the semiconductor substrate 202 and patterned for the implantation of the bottom side 204 of the varactor 200 (FIG. 2), as shown in FIG. 8. The bottom side 204 is then implanted into the semiconductor substrate 202, and the resist used to form the bottom side 204 is removed. An anneal is performed if required to remove damage caused by the implantation step.

Another resist (not shown) is deposited onto the semiconductor substrate 202 and patterned for the implantation of the top side 206 and the doped source/drain regions 228 of the side wells 224, as shown in FIG. 9. The top side 206 and the doped source/drain regions 228 are then implanted into the semiconductor substrate 202. The resist used to form the top side 206 and the doped source/drain regions 228 is removed.

Another resist (not shown) is deposited onto the semiconductor substrate 202 and patterned for the implantation of the doped source/drain regions 216 of the bottom side 204, as shown in FIG. 10. The doped source/drain regions 216 are then implanted into the semiconductor substrate 202. The resist used to form the doped source/drain regions 216 is removed.

Additionally, when performing other CMOS steps, it is preferable to keep lightly doped drain material out of the varactor regions. Otherwise, lightly doped drain implants could cause problems with the operation of the varactor 200 (FIG. 2).

A blocking oxide 238, as shown in FIG. 11, is deposited onto the semiconductor substrate 202 and masked and etched so as to be patterned for the formation of the salicide layer 218 (FIG. 2) in the source drain region 206. "Salicide" is an acronym for "self aligned silicide." The blocking oxide 238 eliminates any silicide leakage so that silicide does not form on the edge of the STI structures 212 abutting the top side 206.

An appropriate metal (not shown) is deposited onto the semiconductor substrate 202 and the blocking oxide 238 (FIG. 11) to react with the top side 206 and the doped source/drain regions 216 and 228 to form the salicide layers 218, as shown in FIG. 12. Ti, Co, Pt and Ni metals are commonly used for this silicidation process. Any unreacted metal is then removed. The blocking oxide 238 is also removed.

A layer of oxide 240 is then deposited onto the semiconductor substrate 202, as shown in FIG. 2. The bottom side electrical contacts 214, the top side electrical contact 220 and the well contacts 226 are then formed by conventional fabrication techniques into the layer of oxide 240 to contact the salicide layers 218 using tungsten plugs or copper or aluminum interconnects or an alloy thereof.

The subject matter herein has the advantage of enabling a varactor in an integrated circuit with an almost linear capacitance/voltage characteristic response and a lower parasitic resistance. Therefore, the varactor can be used in a wider variety of applications with greater ease of design than can the prior art. Additionally, fabrication of the varactor can be incorporated into the conventional flow of CMOS processes.

Presently preferred embodiments of the subject matter herein and its improvements have been described with a degree of particularity. This description has been made by way of preferred example. It should be understood that the scope of the claimed subject matter is defined by the following claims, and should not be unnecessarily limited by the detailed description of the preferred embodiments set forth above.

What is claimed is:

1. A varactor comprising, a diode junction;

a depletion region adjacent to the diode junction; and a doped region beginning at the diode junction, including the depletion region and having a nonuniform dopant concentration profile that continuously increases with increasing depth of the doped region starting from the diode junction and continuing to a peak concentration region at the deepest portion of the doped region;

and wherein the continuously increasing nonuniform dopant concentration profile causes the varactor to have an approximately linear capacitance/voltage response characteristic.

2. A varactor as defined in claim 1 wherein:

the nonuniform dopant concentration profile is defined by an equation N=B×exp(m), where N is the dopant concentration x is the depth of the doped region, B is a concentration constant and m is an exponent that determines the degree of curvature of the dopant profile, and m is greater than 1.

3. A varactor as defined in claim 2 wherein m is about 3.

4. A varactor as defined in claim 3 wherein: B is in a range from about 1.0E19/cm3 to about 1.0E19/cm3 and m is greater than one.

5. A varactor as defined in claim 4 wherein B is about $1.0E16/cm^3$.

* * * * *